United States Patent [19]
Roberts

[11] Patent Number: 4,792,926
[45] Date of Patent: Dec. 20, 1988

[54] HIGH SPEED MEMORY SYSTEM FOR USE WITH A CONTROL BUS BEARING CONTIGUOUS SEGMENTIALLY INTERMIXED DATA READ AND DATA WRITE REQUEST SIGNALS

[75] Inventor: Barry R. Roberts, Lindenhurst, Ill.

[73] Assignee: Kabushiki Kaisha Toshiba, Kawasaki, Japan

[21] Appl. No.: 806,427

[22] Filed: Dec. 9, 1985

[51] Int. Cl.⁴ .......................... G11C 7/00; G11C 8/00
[52] U.S. Cl. .................................... 365/189; 365/233; 365/239; 365/194
[58] Field of Search ................. 365/73, 189, 230, 194, 365/239, 233

[56] References Cited
U.S. PATENT DOCUMENTS 3,851,313  11/1974  Chang .................................. 365/239
4,222,102   9/1980  Tansen et al. ....................... 364/200
4,403,308   9/1983  Girard ................................. 365/222
4,406,013   9/1983  Reese et al. .......................... 377/29

Primary Examiner—Terrell W. Fears
Assistant Examiner—Melissa J. Koval
Attorney, Agent, or Firm—Finnegan, Henderson, Farabow, Garrett and Dunner

[57] ABSTRACT

A high speed memory system for 100% bandwidth use with a control bus bearing contiguous sequentially intermixed data read and data write signals including a first buffer for reading data from a storage means into the data bus and a second buffer for writing data from the data bus into the storage means and a memory control sensitive to the order of received write requests and read requests signals to avoid any simultaneous utilization of the data bus and storage means in accordance with a prearranged schedule of preferential utilization of the data bus and storage means. The subject invention and related method further contemplates the employment of a plurality of input/output ports which are responsive to data read and/or data write request signals on the control bus for reading data from and/or writing data into the data bus in synchronism with the utilization of the first and second buffers.

9 Claims, 10 Drawing Sheets

HIGH SPEED MEMORY SYSTEM FOR USE WITH A CONTROL BUS BEARING CONTIGUOUS SEGMENTIALLY INTERMIXED DATA READ AND DATA WRITE REQUEST SIGNALS

BACKGROUND OF THE INVENTION

I. Field of the Invention

This invention relates to a high speed memory system and related method with 100% bandwidth capability.

II. Background Information

Memory systems are known which have the capacity to store a large amount of data and which further have the capacity to communicate that data to a plurality of input/output ports over an interconnecting data bus. One such memory system is illustratively illustrated in FIG. 1. The prior art memory system of FIG. 1 includes a memory board 10, a plurality of input/output ports 12, a data bus 14, an address bus 16, a control bus 18, and a request and acknowledge bus 20.

Memory board 10 is illustrated as comprising address buffer 22, memory control 24, memory 26 and data buffer 28. Address buffer 22 has an input connected to address bus 16 and an output connected to an address input of memory 26. Memory 26 has a data terminal coupled to a first data bus terminal of data buffer 28 and data buffer 28 in turn has a second data bus terminal connected to data bus 14. The operation of address buffer 22, memory 26 and data buffer 28 is governed by the operation of memory control 24 which has an input connected to control bus 18.

Input/output ports 12 each comprise an address generator 30, input/output port control 32, memory 34 and data buffer 36. Address generator 30 has an output coupled to address bus 16. Address generator 30 is coupled by address bus 36 to an address bus terminal of memory 34. Memory 34 has a data bus terminal connected by data bus 38 to a first data bus terminal of data buffer 36. Data buffer 36 has a second data bus terminal coupled to data bus 14. The operation of address generator 30, memory 34 and data buffer 36 is governed by input/output port control 32. Input/output port control 32 has a first input port terminal coupled to control bus 18 and a second input terminal coupled to request and acknowledge bus 20.

The prior art memory system of FIG. 1 further includes a request arbitration unit 40 which includes a request arbitration circuit 42 coupled to request and acknowledge bus 20.

In operation of the prior art circuit illustrated in FIG. 1, input/output ports 12 generate request signals in input/output port control 32 to either read data from memory 26 of memory board 10 or to write data into memory 26 of memory board 10. These request signals are transmitted over request and acknowledge bus 20 and received by request arbitration circuit 42. Circuit 42 determines which input/output port should be given priority and therefore access to memory board 10. Circuit 42 then sends a corresponding priority acknowledgement signal over request and acknowledge bus 20 to the port 12 to which priority has been granted. This acknowledgement is received over bus 20 by input/output port control 32 of the selected port 12. Input/output port control 32 of the selected port 12 then issues the appropriate data read request or data write request over contool bus 18 for receipt by memory port 10. In addition, control 32 authorizes address generator 30 to transmit the appropriate address signal over address bus 16 for receipt by address buffer 22 of memory board 10. Control 32 in the case of a write data request, further causes the appropriate data to be read from memory 32 onto data bus 14 through the operation of data buffer 36. In the case of a read data request, input/output port control 32 operates to control transfer from data bus 14 through data buffer 36 into memory 34, of data read from memory 26 onto bus 14 by operation of memory board 10.

In turn, memory board 10, upon receipt of a read data request signal by memory control 24 over control bus 18, operates to cause address buffer 22 to deliver the appropriate address data from address bus 16 to memory 26 and operates to read from memory 26 the addressed data through data buffer 28 onto data bus 14. Upon receipt of a write data request signal over control bus 18, memory control 24 operates, as is well known to those skilled in the art, to write data from data bus 14 through data buffer 28 into memory 26 at an address location indicated by the address received over address bus 16 through address buffer 22.

Prior art memory systems such as those illustrated in FIG. 1 may be said to operate in a sequence of memory cycles each of which memory cycle includes a request cycle phase, access cycle phase, and data transfer cycle phase as is illustrated in FIG. 2. As may be seen in FIG. 2, during the request cycle phase of memory cycle 1 a read request signal R1 is received by memory board 10 over control bus 18. In the access phase of subsequent memory cycle 2, read request R1 results in a transfer of data to be read from memory 26 to data buffer 28. In the data transfer cycle phase of subsequent memory cycle 3 read request R1 results in the read data being transferred from data buffer 26 onto data bus 14 for receipt by the requesting input/output port 12. Accordingly, a reading of data from memory board 10 requires a request cycle phase of memory cycle 1, a subsequent access cycle phase of memory cycle 2, and a still subsequent data transfer cycle phase of memory cycle 3.

As is further illustrated in FIG. 2, memory cycle 2, in addition to executing the access cycle phase for read request R1 is also capable of receiving a second data read request R2 in the request cycle phase. Data request R2 results in a data access cycle phase in memory cycle 3 and a data transfer cycle phase in memory cycle 4.

To write data into memory board 10, a data write request W1 is received over control bus 18 during the request cycle phase of memory cycle 4. During the data transfer cycle phase of memory cycle 5, data to be written into memory 26 is received from data bus 14 and stored in data buffer 28. During the access cycle phase of memory cycle 6, as shown in FIG. 2, write request W1 data is transferred from data buffer 28 to memory 26. As is also shown in FIG. 2, during the request cycle phase of memory cycle 5 a second write request W2 may be received which results in a data transfer cycle phase for write request W2 during memory cycle 6 and a subsequent access cycle phase for write request W2 during memory cycle 7.

The prior art system of FIG. 1 thus is capable of executing sequentially received write requests and sequentially received read requests during request cycle phases of consecutive memory cycles. However, the prior art system of FIG. 1 is not capable of receiving contiguous sequentially intermixed read and write requests. The term "contiguous sequential requests" refers to requests which are received in time sequence from one another during a continuous series of request cycle phases; that is to say the requests are received in a series of request cycle phases which are 100% utilized. For example, as shown in FIG. 3, if a write request W1 is received by the prior art system of FIG. 1 in a request cycle phase of a memory cycle 2 which immediately follows a request cycle phase in which a read request R1 was received (thereby creating contiguous sequential intermixed read and write requests), there is a conflict during the data transfer cycle phase of the subsequent memory cycle 3 between read request R1 and write request W1. Specifically, during the data transfer cycle phase of memory cycle 3 an attempt is made to move the read request R1 data from data buffer 28 to data bus 14 and at the same time during the same data transfer cycle phase of memory cycle 3 there is an attempt to move the data to be written in response to write request W1 from data bus 14 to data buffer 28. This simultaneous attempt to access data bus 14 results in an intolerable clash during the data transfer cycle phase of memory cycle 3.

A similar impermissible clash results in the access cycle phase of the third memory cycle following sequential write requests and read requests. This clash is shown with regard to memory cycles 5, 6 and 7 in FIG. 3. Specifically, with write request W2 and subsequent read request R2 in request cycle phases of contiguous sequential memory cycles 5 and 6, during the access cycle phase of memory cycle 7 an attempt is made to move the data to be read in response to read request R2 from memory 26 to data buffer 28 and to simultaneously during the same access cycle phase of memory cycle 7 to move data to be written in response to write request W2 from data buffer 28 to memory 26. As a consequence, there is a simultaneous attempt to access memory 26 which results in an impermissible clash.

To avoid such impermissible clashes as those illustrated above with regard to FIG. 3, prior art systems as illustrated in FIG. 1 employ a request arbitration circuit 42 which assures that at no point will there be contiguous sequential read requests and write requests or contiguous sequential write requests and read requests of the type referred to above with regard to FIG. 3. Instead, whenever a change is to be made from a read request to a write request or from a write request to a read request in the request cycle phases of contiguous sequential memory cycles, one request cycle phase of a memory cycle between the change must be left vacant as is illustrated in FIG. 2. This means that in prior art systems as shown in FIG. 1 there is less than 100% bandwidth utilization of data bus 14, since each vacant request cycle phase of a memory cycle will ultimately result in a corresponding vacant data transfer cycle phase of a subsequent memory cycle and a vacant access cycle phase of a subsequent memory cycle.

These vacant data transfer cycle phases and access cycle phases are illustrated in FIGS. 4 and 5. In FIG. 4 port 1 is illustrated as generating a series of six contiguous sequential read requests R1 through R6 over a control bus. Subsequently, port 2 executes a series of contiguous consecutive write requests W1 through W5. However, request arbitration circuit 42 of FIG. 1 is required to leave the request cycle phase of memory cycle 7 vacant in order to avoid a data transfer cycle phase clash of the type discussed above with regard to FIG. 3. Moreover, port 3 is illustrated in FIG. 4 as subsequently sending a series of read request signals R1 through R4 over a control bus which also must be separated from write requests W1 through W5 by a vacant request cycle phase for memory cycle 13. As a consequence, access cycle phases of memory cycles 8 and 9 are left vacant and data transfer cycle phases of memory cycles 14 and 15 are left vacant as shown in FIG. 4. This results in less than 100% bandwidth for the system of FIG. 1.

In FIG. 5 ports 1, 2 and 3 are shown to have generated alternative read and write requests. As a consequence, the request cycle phase of each even memory cycle 2, 4, 6, 8, 10, 12, 14, 16 and 18 must be maintained vacant in order to avoid the clashes disclosed above with regard to FIG. 3. This results in the access cycle phases of memory cycles 3, 4, 7, 8, 11, 12, 15, 16 and 19 remaining vacant and the transfer cycle phases of memory cycles 5, 6, 9, 10, 13, 14, 17 and 18 remaining vacant. As a consequence, the prior art system of FIG. 1 experiencing a read and write request sequence as shown in FIG. 5 would have only a 50% bandwidth utilization.

SUMMARY OF THE INVENTION

It is, accordingly, an object of the present invention to provide a high speed memory system and related method which provides 100% bandwidth utilization without regard to the order in which contiguous sequential read and write requests are received.

Additional objects and advantages of the subeect invention will be set forth in part in the description which follows, and in part will be obvious from the description or may be learned by practice of the invention.

To achieve the foregoing object, and in accordance with the purpose of the invention as embodied and broadly described herein, a high speed memory system including a control bus bearing sequentially intermixed data read and data write request signals and a data bus, is provided, which system comprises: (a) stored means for holding data; (b) first means for reading dataffrom the storage means onto the data bus; (c) second means for writing data from the data bus onto the storage means; and (d) memory control means for utilizing the first means in response to a data read request signal on the control bus and for utilizing the second means in response to a data write request on the control bus to permit contiguous sequential receipt and subsequent execution of the sequentially intermixed data read and data write request signals. Preferably, the first means comprises a data read buffer and the second means comprises a data write buffer. It is further preferable that the memory cntrol means, in response to receipt of a read request signal, utilizes the data bus, the data read buffer and the storage means to transfer data from the storage means to the data read buffer and from the data read buffer to the data bus, and that the memory control means, in response to receipt of a write request signal, utilizes the data bus, the data write buffer and the storage means to transfer data from the data bus to the data write buffer and from the data write buffer to the storage means. The memory control means further includes specifically in the preferred embodiment means for resolving potential clashes between required access of the data read and data write buffers to the storage means and/or to data bus as a consequence of the contiguous sequentially intermixed data read and data write request signals. Specifically, the memory control means preferably includes means for resolving such potential clashes in favor of the data write buffer, although it should be understood that the memory control means may also resolve the potential clashes in favor of the data read buffer or may resolve such clashes in accordance with some other prearranged schedule.

In different words, the high speed memory system of the subject invention may be deemed to comprise a data bus; a control bus; means for placing read and write request signals on the control bus; storage means for holding data; and a memory control including (i) a memory data read buffer means, including a memory data read buffer memory, for transferring data from the storage means to the memory data read buffer memory in response to a MEMORY READ ACCESS signal and for transferring data from the memory data read buffer memory to the data buffer in response to a MEMORY READ DATA signal; (ii) a data write buffer means, including a memory data write buffer memory, for transferring data from the data bus to the memory data write buffer memory in response to a MEMORY WRITE DATA signal and for transferring data from the memory data write buffer memory to the storage means in response to a MEMORY WRITE ACCESS signal; (iii) memory clash detection logic means for generating, as required in response to read request signals received from the control bus, the MEMORY READ ACCESS and MEMORY READ DATA signals; for generating, as required in response to write request signals received from the control bus, the MEMORY WRITE DATA and MEMORY WRITE ACCESS signals; and for preventing simultaneous generation of MEMORY READ DATA and MEMORY WRITE DATA signals and simultaneous generation of MEMORY READ ACCESS and MEMORY WRITE ACCESS signals.

Preferably, the above-mentioned clash detection means includes means for delaying MEMORY DATA READ signals until no additional MEMORY WRITE DATA signal is required and for delaying MEMORY READ ACCESS signals until no additional MEMORY WRITE ACCESS signal is required. It is further preferable that the above-mentioned system include a plurality of data ports, each of which includes port data read buffer means for transferring data from the data bus in response to a PORT READ DATA signal and/or a port data write buffer means for transferring data to the data bus in response to a PORT WRITE DATA signal and each of the data ports further including port clash detection logic means for generating a PORT READ DATA signal in response to a data read request signal on the control bus for that port; for generating a PORT WRITE DATA signal in response to a write data request signal on the control bus for that port; and, in response to data read and data write request signals on the control bus, for synchronizing generation of the PORT READ DATA and PORT WRITE DATA signals with generation by the memory clash detection logic means of a corresponding MEMORY READ DATA and MEMORY WRITE DATA signal, respectively.

Moreover, the subject invention may be viewed as a method for high speed operation of a memory system which includes storage for holding data, a plurality of ports, a data bus and a control bus, comprising the steps of: (a) generating data read requests on the control bus to transfer data from the storage over the data bus to the selected port in sequential READ DATA FROM STORAGE and WRITE DATA INTO DATA BUS cycles; (b) generating data write requests on the control bus to transfer data from a selected port over the data bus to the storage in sequential READ DATA FROM DATA BUS and WRITE DATA INTO STORAGE cycles, the data write requests and data read requests being contiguously and sequentially intermixable on the control bus; (c) preventing simultaneous READ DATA FROM STORAGE and WRITE DATA INTO STORAGE and simultaneous WRITE DATA INTO STORAGE and READ DATA FROM DATA BUS cycles by detecting from the data read requests and data write requests on the control bus when simultaneous READ DATA FROM STORAGE and WRITE DATA FROM STORAGE and simultaneous WRITE DATA ONTO DATA BUS and READ DATA FROM DATA BUS cycles are scheduled to occur and by delaying selective ones of the READ DATA FROM STORAGE, WRITE DATA INTO STORAGE, WRITE DATA ONTO DATA BUS, and READ DATA FROM DATA BUS cycles in accordance with a prearranged schedule to prevent simultaneous READ DATA FROM STORAGE and WRITE DATA FROM STORAGE cycles and to prevent simultaneous WRITE DATA ONTO DATA BUS and READ DATA FROM DATA BUS cycles.

It is further preferable that the method of the subject invention include the step of transferring, at the ports in response to the data read requests and data write requests on the control bus, data between those ports and the data bus as a function of the prearranged schedule.

DESCRIPTION OF THE PREFERRED EMBODIMENT

Reference will now be made in detail to the present preferred embodiment of the subject invention as illustrated in the accompanying drawings.

Figure 1:
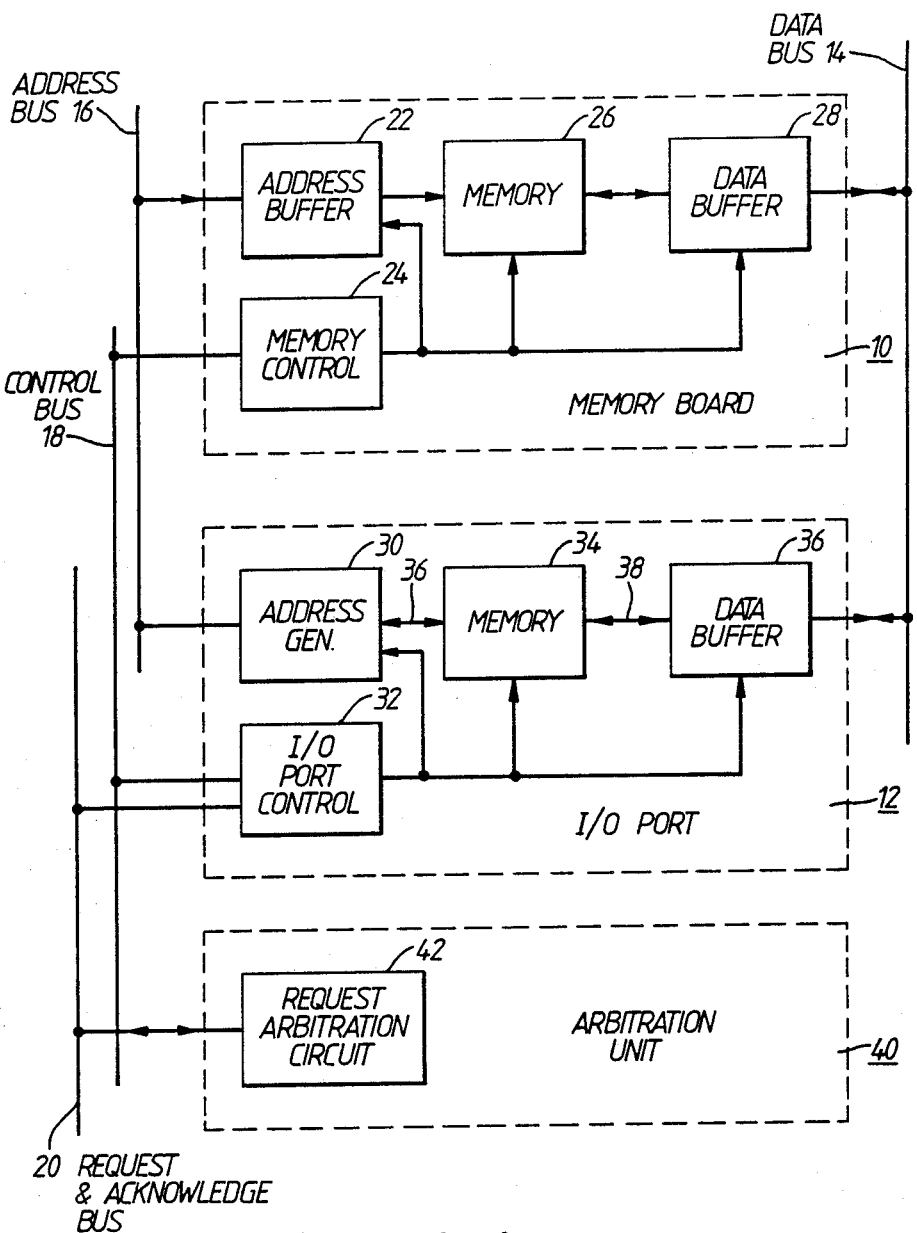
FIG. 1 is a block diagram of a prior art memory system.
Figure 6:
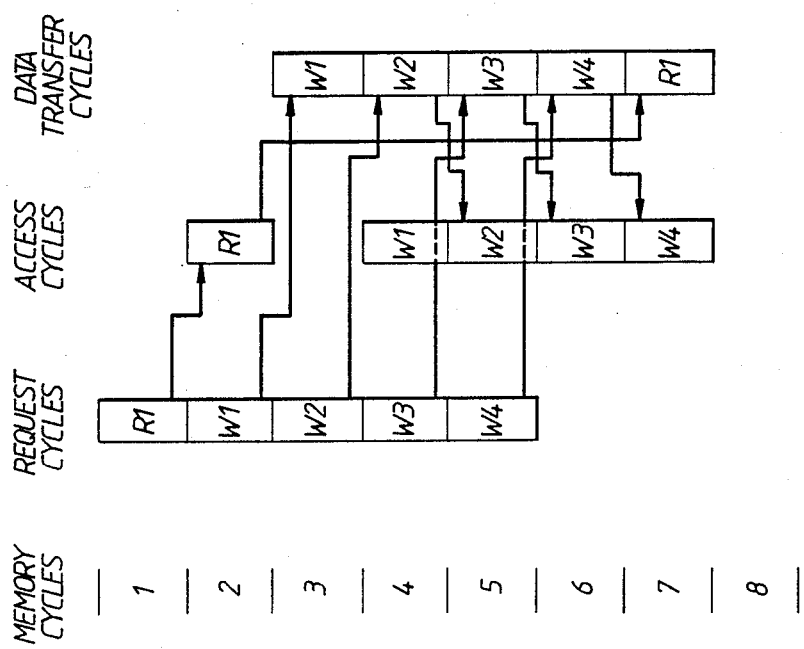
FIG. 6 illustrates a method of executing contiguous sequential read and write requests in accordance with the teachings of the subject invention.

The subject invention comprises a mechanism to determine when potential data transfer cycle phase clashes and/or access cycle phase clashes would ordinarily occur and to thereafter delay selected ones of the data transfer cycle phases and access cycle phases in accordance with a prearranged schedule. Specifically, as illustrated in FIG. 6 a read request R1 is followed by a write request W1 in contiguous sequential request cycle phases of memory cycles 1 and 2. Given the prior art system of FIG. 1, a clash as disclosed above with regard to FIG. 3 would be expected to occur during the transfer data cycle phase of memory cycle 3. However, the subject invention anticipates this clash and, in a preferred embodiment, delays the data transfer cycle phase for read request R1 until the next available data transfer cycle phase. Specifically, as illustrated in FIG. 6 with four write requests W1 through W4 existing in contiguous sequential request cycle phases of memory cycles 2 through 5, the next available transfer cycle phase for read request R1 exists during the data transfer cycle phase of memory cycle 7. Accordingly, the subject invention delays the data transfer cycle phase for read request R1 until the data transfer cycle phase of memory cycle 7.

Although the embodiment of the subject invention disclosed with regard to FIG. 6 contemplates resolving anticipated read request/write request data transfer cycle phase clashes by delaying the data transfer cycle for the read request until the next available data transfer cycle phase, it should be understood that preference may instead be given to the data transfer cycle phase of the read request over the data transfer cycle phase of the write request. In addition, some prearranged schedule of preference may also be employed. For purposes of simplicity, and in accordance with the present preferred embodiment of the subject invention, the prearranged schedule disclosed throughout will anticipate giving preference to all write requests over all read requests, by way of illustration and not limitation.

Figure 3:
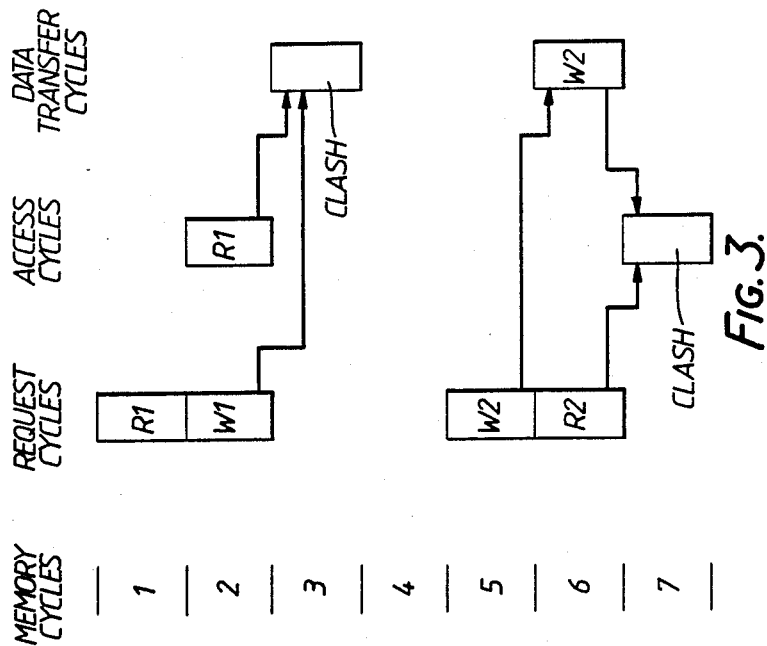
FIG. 3 illustrates clash producing memory cycles of a prior art memory as shown in FIG. 1.
Figure 2:
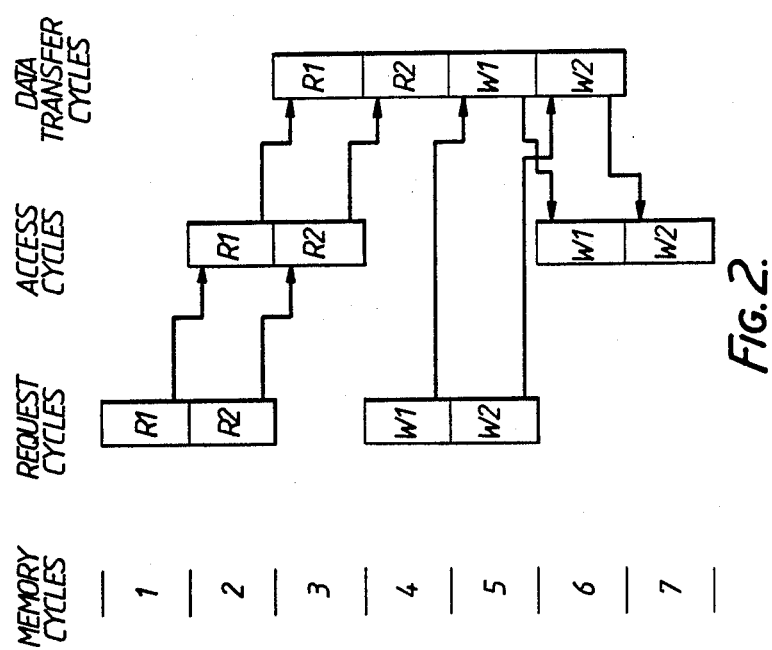
FIG. 2 illustrates memory cycles of a prior art memory system as shown in FIG. 1.
Figure 4:
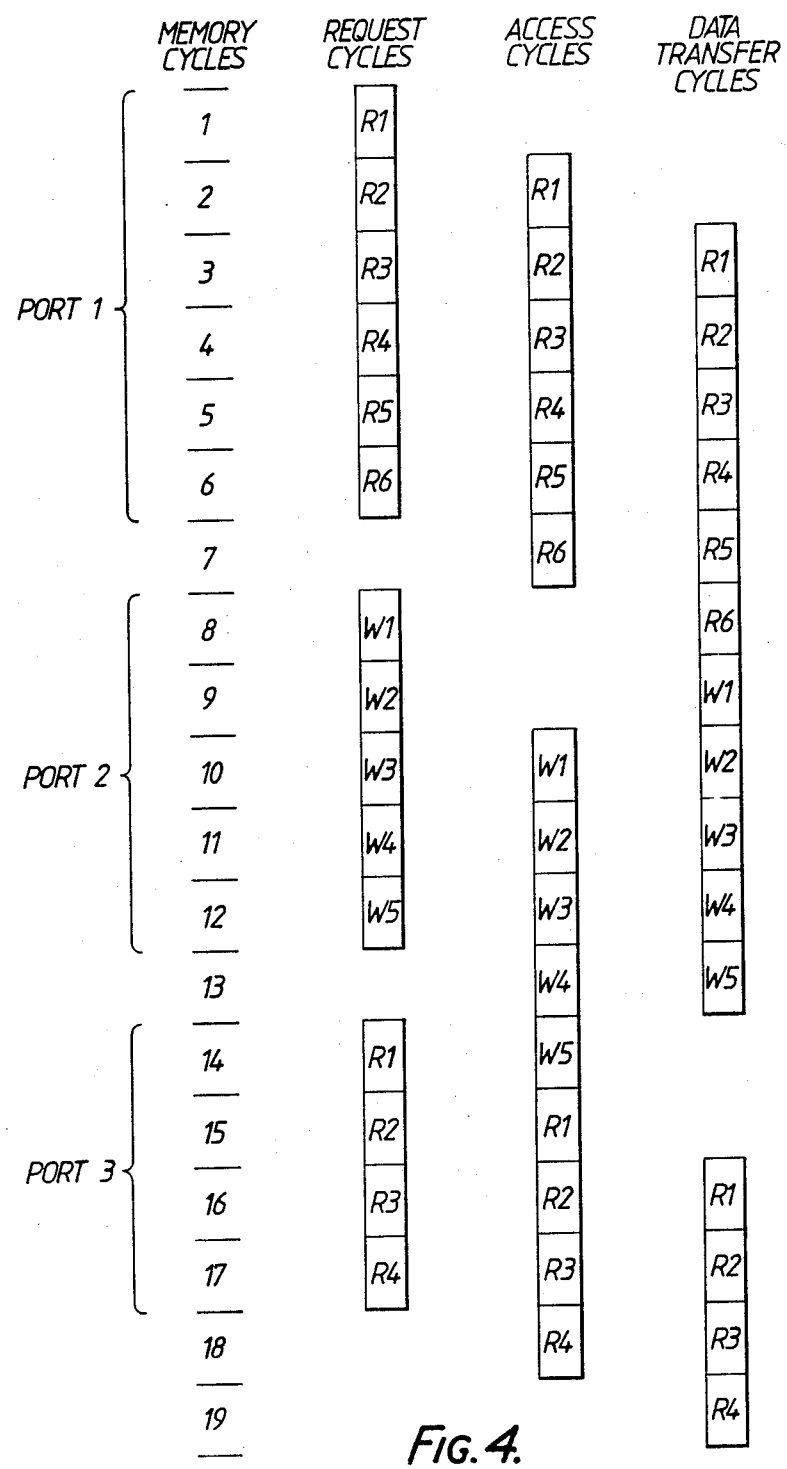
FIG. 4 illustrates the memory cycles of a prior art system of FIG. 1 in which a series of read requests are followed by a series of write requests which are in turn followed by a series of read requests.
Figure 5:
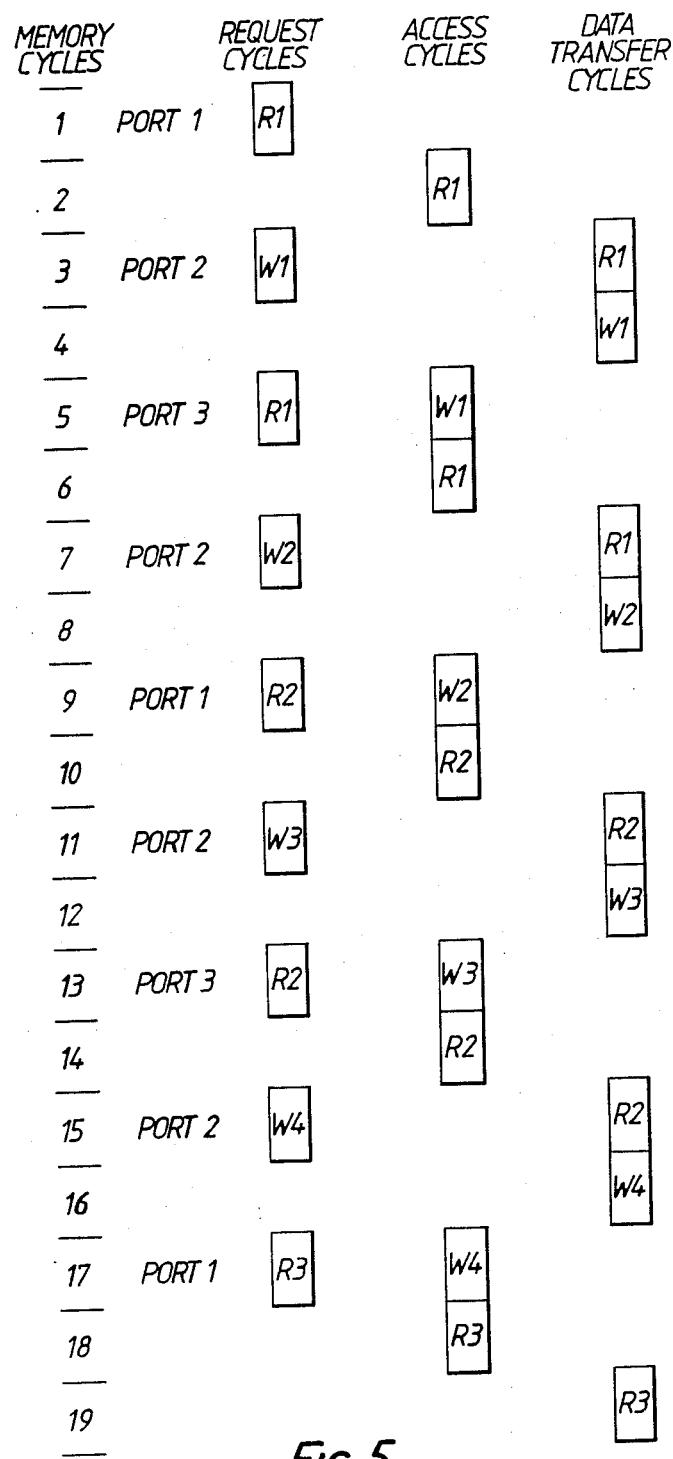
FIG. 5 illustrates the memory cycles of a prior art signal system of FIG. 1 in which each single read request is followed by a single write request which is in turn followed by a single read request.
Figure 7:
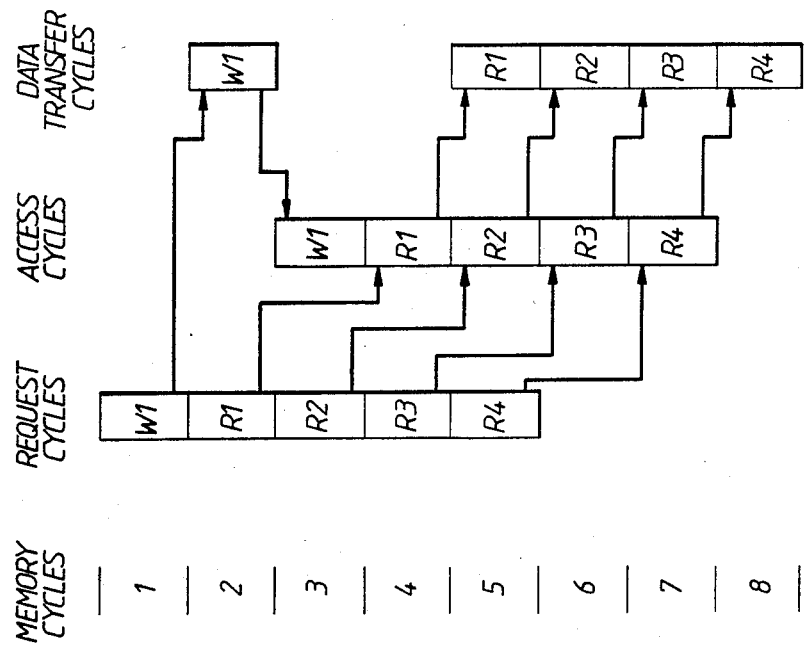
FIG. 7 illustrates a method for executing contiguous sequential write and read requests in accordance with the teachings of the subject invention.

In FIG. 7, a write request W1 is followed by a read request R1 in contiguous sequential request cycle phases of memory cycles 1 and 2, thereby creating a potential access cycle phase clash in memory cycle 3 of the type disclosed above with regard to FIG. 3. However, in accordance with the subject invention, this potential clash is avoided by delaying the access cycle phase for the read request R1 until the next available access cycle phase which, as illustrated in FIG. 7, is scheduled to occur during the access cycle phase of memory cycle 4. Again, the preference illustrated in FIG. 7 of write request W1 access cycle phase over read request R1 access cycle phase is given by way of illustration and not limitation.

Figure 8:
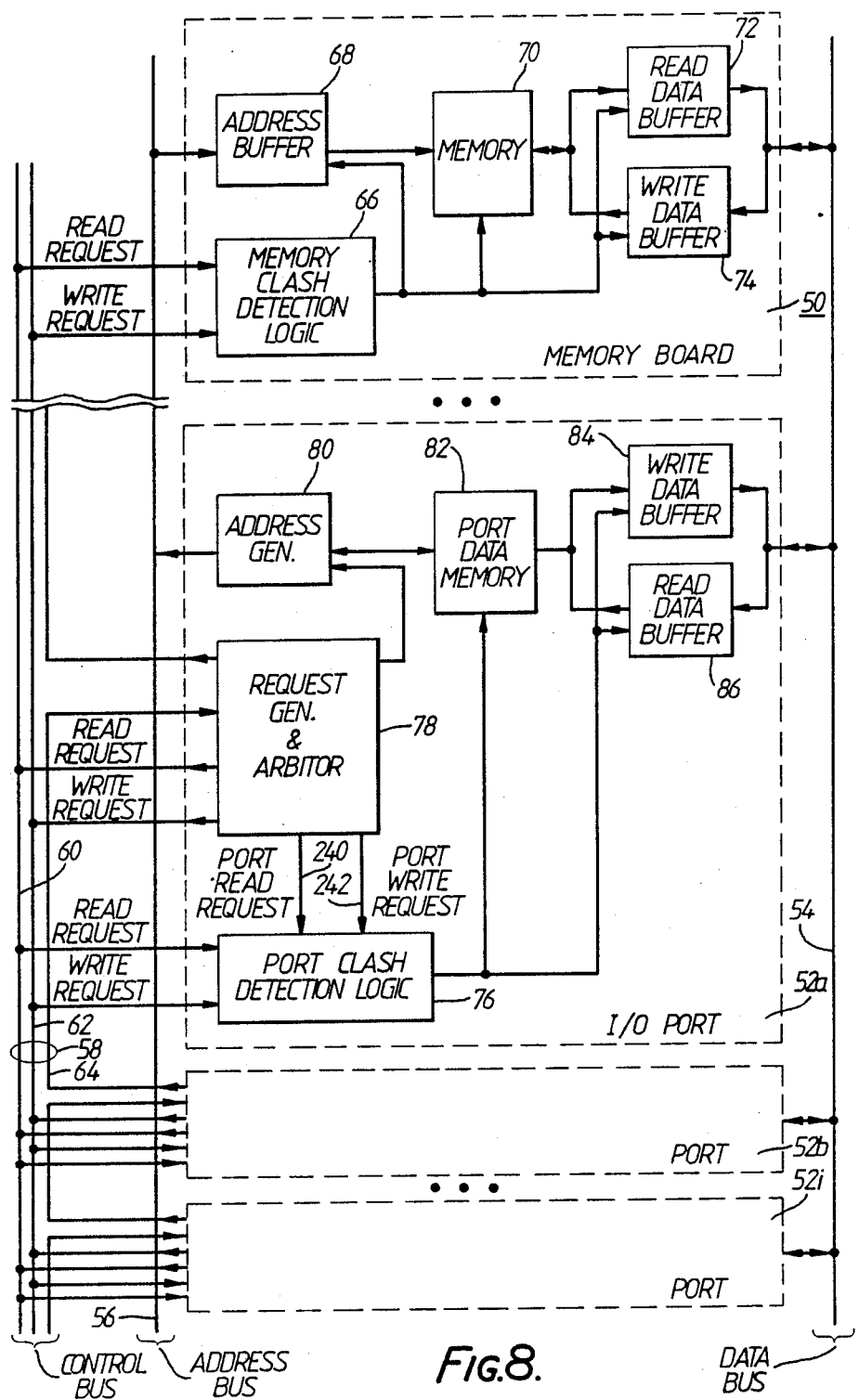
FIG. 8 is a block diagram of a memory system incorporating the teachings of the subject invention.

A block diagram of a memory system incorporating the teachings of the subject invention is illustrated in FIG. 8. The system illustrated in FIG. 8 includes a memory board 50, a plurality of input/output ports 52a–i, a data bus 54, an address bus 56 and a control bus 58 including individual buses 60, 62 and 64. Memory board 50 is shown in FIG. 8 as comprising memory clash detection logic 66, address buffer 68, memory 70, read data buffer 72 and write data buffer 74. Memory clash detection logic 66 is coupled to receive read request signals over bus 60 of control bus 58 and to receive write request signals over bus 62 of control bus 58. Memory clash detection logic 66 has outputs coupled to control operation of address buffer 68, memory 70, read data buffer 72 and write data buffer 74. Address buffer 68 is coupled to receive address signals over address bus 56 and to supply those signals to memory 70 under control of memory clash detection logic 66. Memory 70 has a data bus terminal connected to data bus 54 either through read data buffer 72 or through write data buffe 74, again, depending upon the operation of memory clash detection logic 66.

Input/output ports 52a–i may take on a variety of configurations. By way of example and not limitation, input/output port 52a illustrated in FIG. 8 is shown to comprise port clash detection logic 76, request generator and arbitor 78, address generator 80, port data memory 82, write data buffer 84 and read data buffer 86. Port clash detection logic 76 is coupled to receive read requests over bus 60 of control bus 58 and write requests over bus 62 of control bus 58. Request generator and arbitor 78 is connected in daisy chain fashion to request generator arbitors of other input/output ports 52b–i through bus 64 of control bus 58. In addition, request generator and arbitor 78 is coupled to provide read request signals over bus 60 of control bus 58 and write request signals over bus 62 of control bus 58. Address generator 80 is coupled to communicate address data with data port memory 82 and to provide address data over address bus 56 under the control of request generator and arbitor 78. Furthermore, port data memory 82 has a data bus terminal coupled to communicate data with data bus 54 either through write data buffer 84 or read data buffer 86 depending upon the operation of port clash detection logic 76.

In operation, ports 52a–i which desire either to write memory into memory 70 of memory board 50 or read data from memory 70 of memory board 50 generate an appropriate arbitration signal over daisy chain connected bus 64 of control bus 58. As is well known to those skilled in the art, during each request cycle phase of a memory cycle arbitration signals will be daisy chained to ports 52a–i. As a result of these signals, the highest priority port 52a–i obtains the right to access memory board 50. Specifically, ports 52a–i are daisy chained with the highest priority port first in line in the daisy chain of bus 64 and the lowest priority port last in line. As will be appreciated by those skilled in the art, priority arbitration is determined by having the highest priority port 52a–i send a NO REQUEST signal to the next highest priority port, with that port sending a NO REQUEST signal to the next lowest priority port, and so on, to the lowest priority port. When a particular port along the chain seeks access to memory board 50, all that is required is receipt of a NO ACCESS signal from the next highest priority port and subsequent generation of a REQUEST ACCESS signal to all subsequent lower priority ports along the daisy chain of bus 64. This process will assure access by that port to memory board 50.

Once access has been established, the port obtaining access may generate an appropriate address signal for memory 70 over address bus 56 through operation of address generator 80. Moreover, upon obtaining access to memory board 50, memory generator and arbitor 78 generates an appropriate read or write request signal over buses 60, 62 of control bus 58. This read or write request signal occurs during the request cycle phase of the memory cycle for which the input port has obtained access to memory board 50. For example, assuming port 52a obtains access to memory board 50, during memory cycle 1 as illustrated in FIG. 6, a read request R1 signal will be generated by request generator and arbitor 78 over bus 60 of control bus 58. This read request signal R1 will be received during the request cycle phase of memory cycle 1 by memory clash detection logic 66. Having obtained a read request signal, and having received in the immediately preceding memory cycle no write request signal, memory clash detection logic 66 will control operation of memory board 50 in a manner wheeeby the read request R1 of memory cycle 1 causes the data in memory 70 identified by the address data on bus 64 to be moved from memory 70 to read data buffer 72 during the access cycle phase of subsequent memory cycle 2. In a similar aannear, port clash detection logic 76 monitors the read and write requests over buses 60 and 62 of control bus 58 and therefore knows that there was no write request in the request cycle phase of the immediately precedent memory cycle and, therefore, may anticipate that memory board 50 will be moving the data of memory 70 from the requested address provided by address generator 80 from memory 70 to read data buffer 72 during the access cycle phase of the subsequent memory cycle 2.

However, if a write request W1 exists on bus 62 of control bus 58 during the request cycle phase of memory cycle 2 as illustrated in FIG. 6, both memory clash detection logic 66 and port clash detection logic 76 become aware, independently but simultaneously, of the existence of a potential clash during the data transfer cycle phase of memory cycle 3. To avoid this clash, both memory clash detection logic 66 and port clash detection logic 76 are preprogramed in accordance with a prearranged schedule to delay either the data transfer cycle phase of read request R1 or the data transfer cycle phase of write request W1. In the illustrated embodiment, the prearranged schedule for both memory clash detection logic 66 and port clas detection logic 76 contemplates delay of the read data transfer cycle phase of any data transfer cycle phase clash and, as a consequence, during memory cycle 3 memory clash detection logic 66 executes a transfer of write data W1 from data bus 54 through operation of read data buffer 74 while delaying any transfer of read request data R1 from read data buffer 72 to data bus 54.

Port clash detection logic 76, being aware of the existence of write data request W1 during the request cycle phase of memory cycle 2 delays any operation of read data buffer 86 until the next available data transfer cycle phase. This delay is accomplished without any direct communication with memory board 50, but rather by simply monitoring the read and write requests over control bus 58 and anticipating delays necessitated to avoid clashes in accordance with a prearranged schedule, namely, as in the preferred illustrated embodiment, a schedule which gives preference to all write requests over all read requests.

Given the order of read and write requests illustrated in FIG. 6, the next available data transfer cycle phase for read data R1 exists during the data transfer cycle phase of memory cycle 7. Both memory clash detection logic 66 and port clash detection logic 76 are aware of this fact by having monitored the read and write requests during the request cycle phases of memory cycles 1 through 6. Accordingly, during the data transfer cycle of memory cycle 7, memory clash detection logic 66 operates to permit read data buffer 72 to finally release the data of read request R1 onto data bus 54 and port clash detection logic 76 operates to accept the data of read request R1 from data bus 54 through operation of read data buffer 86.

With regard to access cycle phase clashes, as shown in FIG. 7, the next available access phase for a read request R1 which follows a write request W1 occurs during the access cycle phase of the second subsequent memory cycle (memory cycle 4) after the request cycle phase in which the read request was received.

Figure 9:
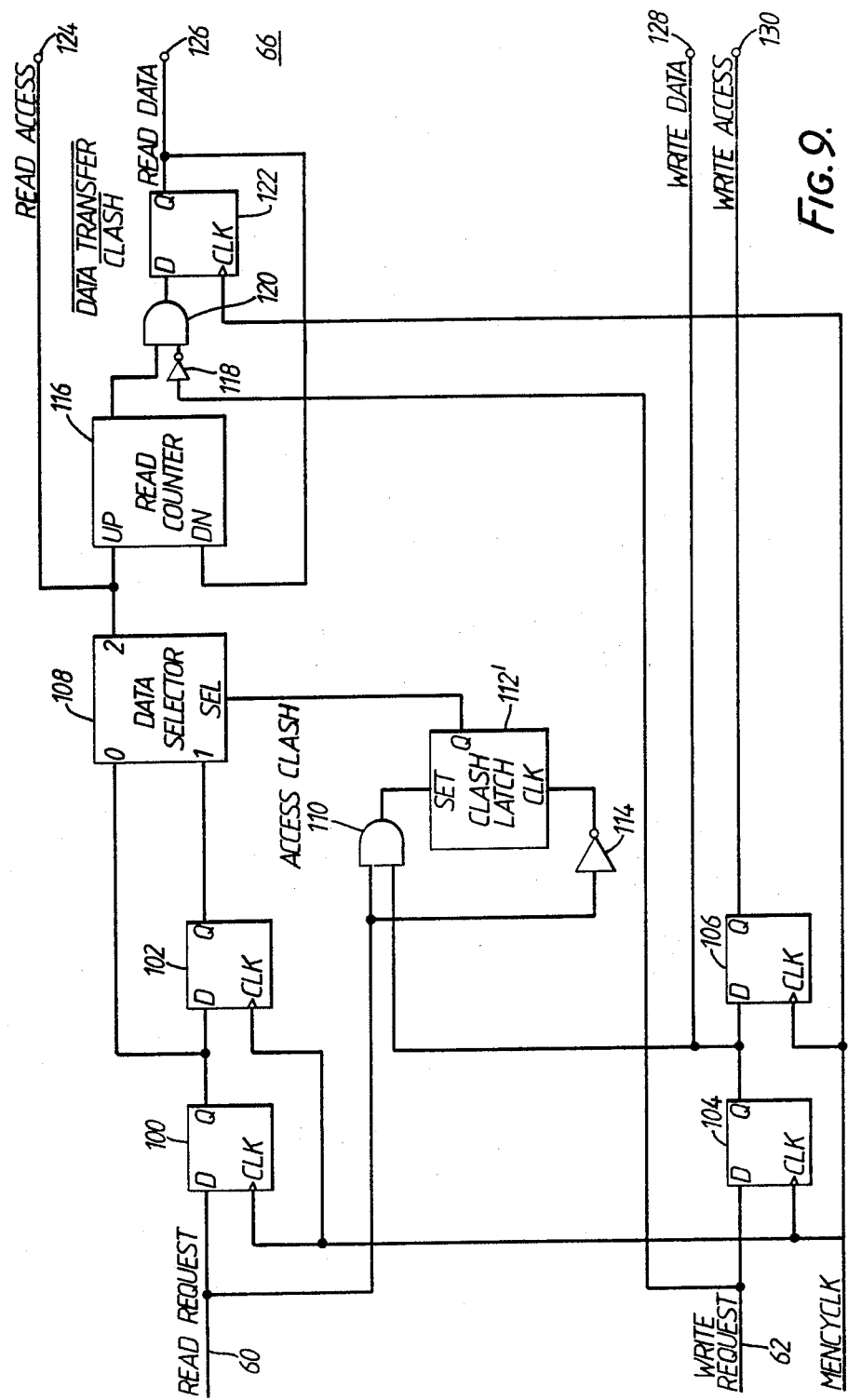
FIG. 9 is a logic circuit diagram of the memory clash detection logic of FIG. 8.
Figure 10:
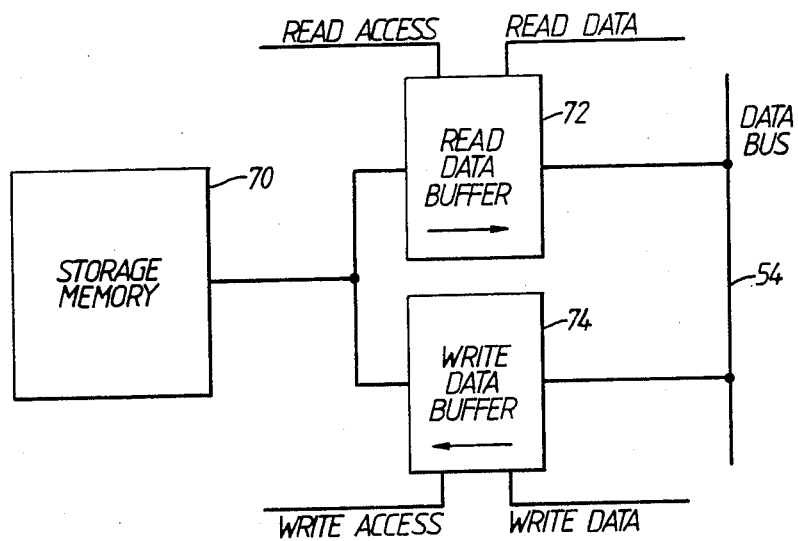
FIG. 10 illustrates in more detail the read and write buffers of the memory board of FIG. 8.

Specific illustrative memory clash detection logic and port clash detection logic circuits are illustrated in FIGS. 9 and 10, respectively.

Referring first to FIG. 9 there is illustrated a preferred form of memory clash detection logic 66. As may be seen in FIG. 9, memory clash detection logic 66 comprises latches 100, 102, 104, 106, 112, and 122; data selector 108; AND gates 110 and 120, inverters 114 and 118; counter 116; read access terminal 124; read data terminal 126; write data terminal 128 and write access terminal 130. Read request signals from bus 60 of control bus 58 are coupled to the data terminal of latch 100, a first terminal of AND gate 110, and to the input of inverter 114. The output of latch 100 is connected to the "0" input terminal of data selector 108 and to the data terminal of latch 102. The output terminal of latch 102 is coupled to the "1" input of data selector 108. Write request signals on bus 62 of control bus 58 are coupldd back to the data input terminal of latch 104 and to the input of inverter 118. The output of latch 104 is, in turn, coupled back to the second input of AND gate 110 and as a WRITE DATA signal on WRITE data output terminal 128.

The output of latch 106 is coupled as a WRITE ACCESS signal to write access terminal 130. The output of AND gate 110 is coupled as a set input to latch 112 and the output of inverter 114 is coupled to the clear input terminal of latch 112. The output of latch 112 is coupled to the select input terminal of selector 108 and the output of selector 108 is coupled both as a READ ACCESS signal to read access terminal 124 and to the count up input terminal of counter 116. The output of counter 116 is coupled to a first input terminal of AND gate 120 whereas the output of inverter 118 is coupled to the second input terminal of AND gate 120. The output of AND gate 120 is coupled to the data input terminal of latch 122 and the output of latch 122 is coupled as a READ DATA signal to read data terminal 126 and to the down input teriinal of counter 116. A system clocking signal MEMCYCLK is connected to the clock inputs of latches 100, 102, 104, 106 and 122.

Memory clash detection logic 66 of FIG. 9 detects and resolves two different types of clashes. First, the circuit of FIG. 9 detects and resolves data transfer cycle phase clashes. These clashes, as mentioned above, occur when a read request is immediately followed by a write request. When a read request R1 of memory cycle 1 as shown in FIG. 6, is immediately followed by a write request W1 in memory cycle 2, a data transfer cycle phase clash is scheduled to occur in memory cycle 3. To avoid this clash, during memory cycle 2 the write request on bus 62 is delivered through inverter 118 to AND gate 120 causing the output of latch 122 to go lowdduring memory cycle 3. If a write request were not present during memory cycle 2, the output of latch 122 would normally have been high rendering a READ DATA signal at terminal 126 during memory cycee 3 to cause data to be read from read data buffer 72 of FIG. 8 onto data bus 54. However, since a write request is present during memory cycle 2 this READ DATA signal is delayed for as many subsequent memory cycles as there are consecutive write request signals through operation of AND gate 120 and latch 122.

As illustrated in FIG. 6, this delay continues until memory cycle 6 during which no write request signal appears on bus 62 and, as a consequence, a positive signal appears through operation of inverter 118 to the second input of AND gate 120. Accordingly, during the next clocked memory cycle, namely memory cycle 7 of FIG. 6, the output of latch 122 goes high causing a READ DATA signal at terminal 126 thereby resulting in the delayed transfer of data from read data buffer 72 to data bus 54.

Thus, in effect, the output of AND gate 120 indicates that no data transfer clash phase exists and, therefore, data may be freely transferred from data read buffer 72 to data bus 54. Counter 116 keeps track of whether one or two read requests have been delayed due to the subsequent receipt of write requests. If two read requests had been delayed, counter 116 assures that during the next memory cycle, assuming no other clash is detected, the second delayed read request data will be transferred from read buffer 72 to data bus 54.

The second form of clash detected and avoided through the operation of the FIG. 9 circuitry is a potential access cycle phase clash of the type illustrated before above with regard to FIGS. 3 and 7. This type of clash occurs when a write request is followed by a read request and is detected through operation of latch 112. Specifically, with regard to the example of FIG. 7, a read request R1 during memory cycle 2 is received at the first input of AND gate 110 at the same time a write request W1 from latch 104 is received at the second input of AND gate 110 (write request W1 having been delayed one memory cycle by the action of latch 104), causing the output of AND gate 110 to go logic high and, therefore, setting latch 112. The setting of latch 112 causes the output of selector 108 to shift from the "0" input to the "1" input during memory cycle 2. Thus, if a read request R0 had been received immediately preceding the write request W1 of memory cycle 1, the output of latch 102 would have been high, causing the output of selector 108 to go high causing a READ ACCESS signal at outuut terminal 124 during memory cycle 2. However, during memory cycle 3 the output of latch 102 would have been low, thereby causing selector 108 to render a low output to terminal 124 during memory cycle 3, thereby preventing a clash during the access cycle phase of memory cycle 3.

In effect, transfer of data from memory 70 to read data 72 would continue to be delayed through operation of selector 108 and latch 112 until no subsequent write request was received over bus 62. In the example of FIG. 7, no write request is received during memory cycle 3, accordingly latch 112 releases selector 108 during memory cycle 3, allowing the output of latch 110 to pass through selector 108 to read access terminal 124 during subsequent memory cycle 4. In this manner, clashes during access cycle phases are avoided.

FIG. 10 is a block diagram of read data buffer 72, write data buffer 74 and memory 70 which shows in more detail the operation of READ ACCESS, READ DATA, WRITE ACCESS and WRITE DATA signals of FIG. 9. Specifically, as may be seen in FIG. 10 the READ ACCESS signal on terminal 124 of FIG. 9 controls the transfer of data from memory 70 to read buffer 72 while the READ DATA signal from terminal 126 of FIG. 9 controls tee transfer of data from read buffer 72 to data bus 54. In a similar manner the WRITE DATA signal at terminal 128 of FIG. 9 controls the transfer of data from data bus 54 to write buffer 74 and the WRITE ACCESS signal at terminal 130 of FIG. 9 controls the transfer of data from write buffer 74 to memory 70.

Figure 11:
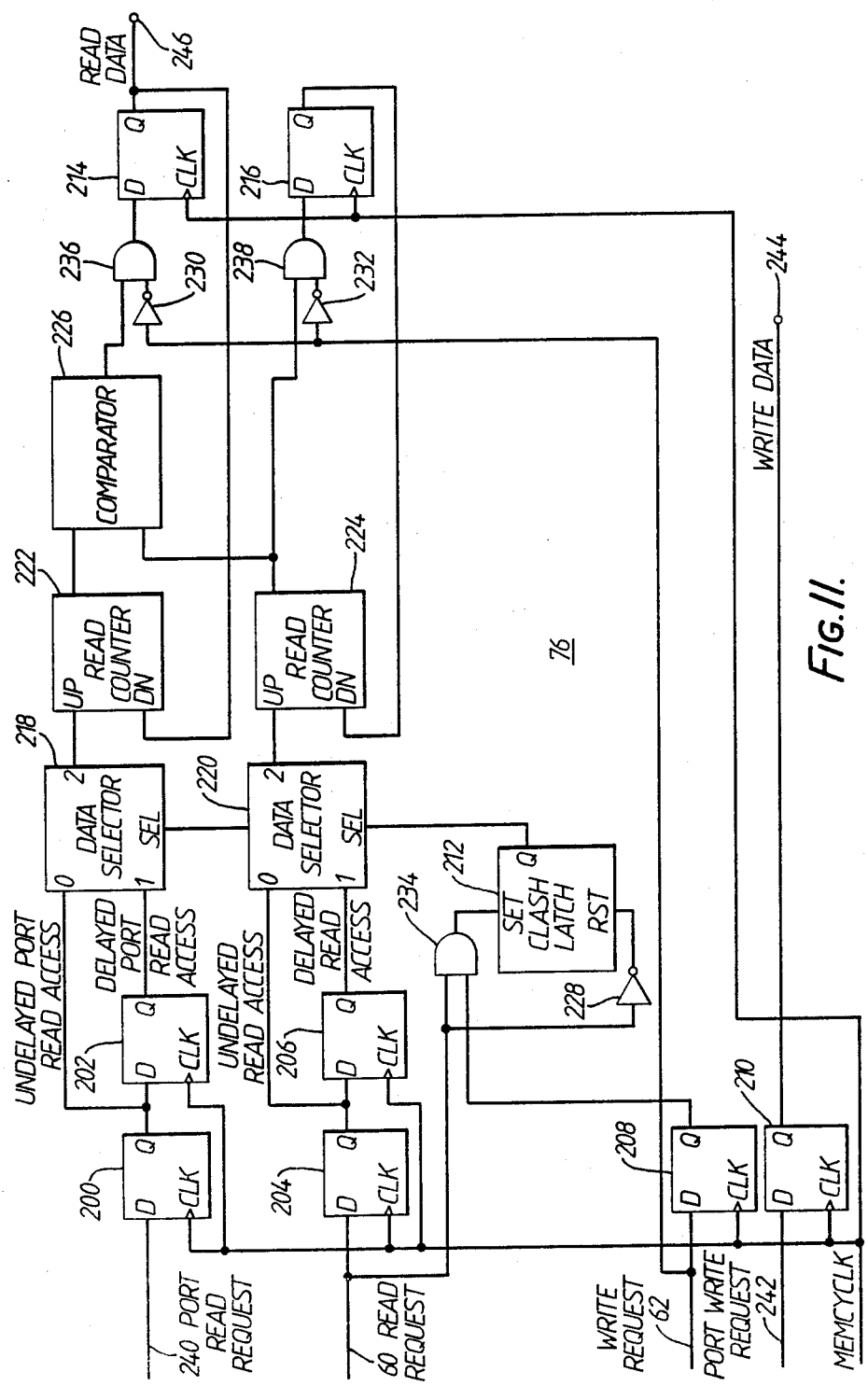
FIG. 11 is a logic circuit diagram of the port clash detection logic of FIG. 8.

Port clash detection logic 76 of FIG. 8 will now be described in more detail with regard to FIG. 11. As is shown in FIG. 11, port clash detection logic 76 comprises latches 200, 202, 204, 206, 208, 210, 212, 214 and 216; data selectors 218 and 220; counters 222 and 224; comparator 226; inverters 228, 230 and 232; AND gates 234, 236 and 238; write data terminal 244 and read data terminal 246. Port clash detection logic 76, in addition to receiving clock signals MEMCYCLK, read request signals over bus 60 of control bus 58 and write request signals over bus 62 of control bus 58, also receives port read request signals over bus 240 from request generator and arbitor 78 (FIG. 8) and port write request signals over bus 242 from request generator and arbitor 78. While read request and write request signals on control bus 58 could be generated from any input/output port, port read request and port write request signals on buses 240 and 242 are unique to port 52a. Thus, port read request and port write request signals on buses 240 and 242 communicate to port clash detection logic 76 that port 52a has, in fact, been awarded access to memory board 50 for those particular requests.

In order to carry out effective communication with memory board 50, in accordance with the teachings of the subject invention, it is also necessary that port 52a maintain appropriate communication with control bus 58 to determine what other read and write requests precede and follow those particular read and write requests generated by port 52a. Thus, port read request signals over bus 240 are coupled to the data input of latch 200 while port write request signals over bus 242 are coupled to the data input of latch 210, and read request signals over bus 60 are coupled to the data input of latch 204 while write request signals over bus 62 are coupled to the data input of latch 208. The read request signals on bus 60 are also coupled to a first input of AND gate 234 and to the input of inverter 228 while the write request signals on bus 62 are also coupled to the input of inverters 230 and 232.

The output of latch 200 is coupled to the "0" input terminal of selector 218 and to the data input terminal of latch 202. In a similar manner the output of latch 204 is coupled to the "0" input terminal of selector 220 and to the data input terminal of latch 206. The output of latch 208 is coupled to a second input of AND gate 234 while the output of latch 210 is coupled as a WRITE DATA signal to write data terminal 244.

The output of AND gate 234 is coupled to the set input of latch 212 while the output of inverter 228 is coupled to the reset input of latch 212. The output of latch 212 is coupled to the select input of both selector 220 and selector 218 while the output of latch 206 is coupled to the "1" input terminal of selector 220 and the output of latch 202 is coupled to the "1" input of selector 218. The output of selectors 218 and 220 are coupled to the input terminals of counters 222 and 224, respectively. The output of counters 222 and 224 are coupled to respective input terminals of comparator 226, the output of which is coupled to a first input of AND gate 236.

The output of counter 224 is also coupled to the second input of AND gate 238. The output of inverter 230 is coupled to the second input of AND gate 236 while the output of inverter 232 is coupled to the second input of AND gate 238. The output of AND gate 236 is coupled to the data input of latch 214 while the output of AND gate 238 is coupled to the data input of latch 216. The output of latch 214 is coupled to read data terminal 246 and is also coupled to the down input of counter 222. The output of latch 216 is coupled to the down input of counter 224.

In operation, the circuit of FIG. 11 controls the transfer of data between a particular port and the data bus 54 in response to the order of application of the data read requests and data write requests over control bus 58 and in accordance with a prearranged schedule. As mentioned above, in the illustrative embodiment of the subject invention, this prearranged schedule gives preference to all write requests over all read requests, although other prearranged schedules certainly could be contemplated and are considered to be within the scope of the subject invention.

Specifically, the circuit of FIG. 11 must operate in synchronism with the memory clash detection logic 66 of memory board 50, without actually having any intercommunication with memory board 50 except in the form of simultaneous receipt of the same read request and write request signals over control bus 58. That portion of the FIG. 11 circuit coupled to receive read requests over bus 60 and write requests over bus 62 operates essentially identical to the memory clash detection logic 66 illustrated in FIG. 9. However, the circuit of FIG. 11 further includes receipt of port read request and port write request signals in order to enable the circuit of FIG. 11 to determine when the read and write requests over control bus 58 are specifically applicable to the port to which the circuitry of FIG. 11 is connected. Thus, a READ DATA signal appears at terminal 246 in synchronism with the appearance of READ DATA signal at terminal 126 of the FIG. 9 circuit, provided that the read request signal resulting in the READ DATA signal at terminal 126 of FIG. 9 is applicable to the input/output port associated with the circuit of FIG. 11. Likewise, a WRITE DATA signal appears at output terminal 244 of the circuit of FIG. 11 in synchronism with the appearance of a WRITE DATA signal at output terminal 188 of the FIG. 9 circuit, provided that the write request signal associated with the WRITE DATA signal at output terminal 128 corresponds to the input/output port associated with FIG. 11.

Figure 12:
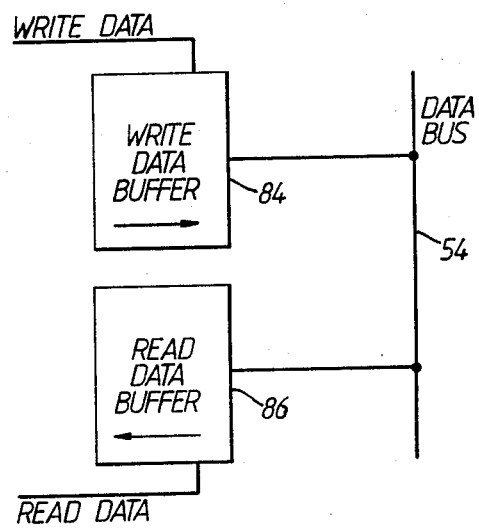
FIG. 12 illustrates the read and write buffers of an input/output port of FIG. 8.

FIG. 12 illustrates write data buffer 84 and read data buffer 86 of FIG. 8 and how the WRITE DATA signal at terminal 244 of FIG. 11 operates to transfer data from write buffer 84 to data bus 54 and the READ DATA signal at terminal 246 of FIG. 11 operates to transfer data from data bus 54 to read buffer 86.

Figure 13:
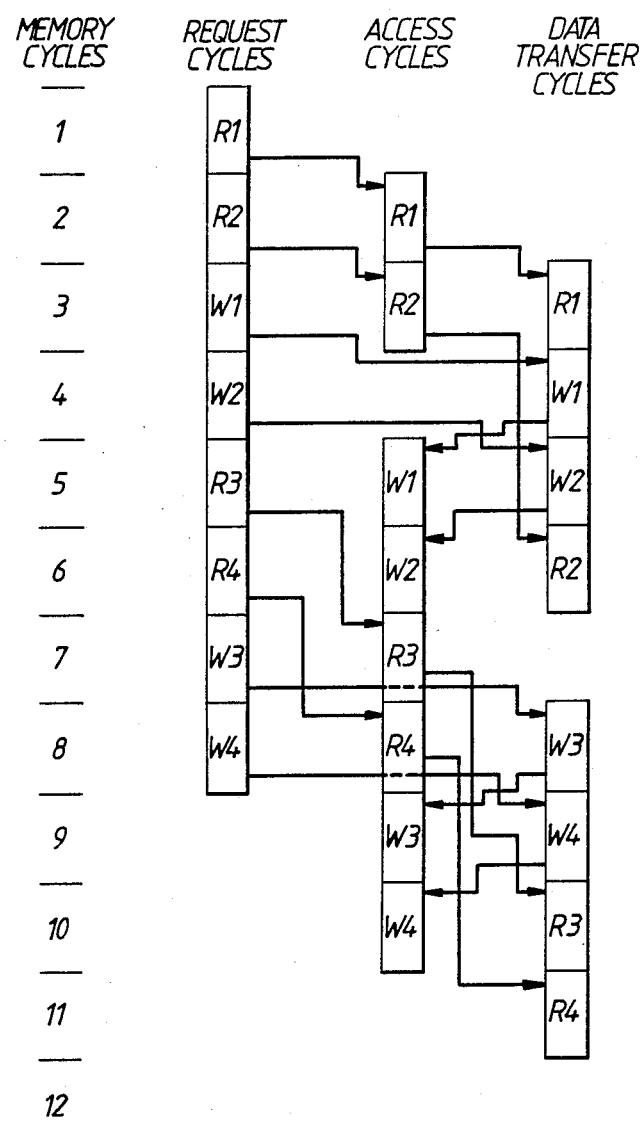
FIG. 13 depicts illustrative memory cycles for use with a memory system incorporating the teachings of the subject invention.

The operation of the illustrated preferred embodiment of the subject invention will now be summarized with regard to the memory cycles illustrated in FIG. 13 and with reference to the circuits of FIGS. 9, 10, 11 and 12. Specifically, there is illustrated in FIGS. 9 and 11 in the form of buses 60 and 62 a control bus 58 bearing contiguous sequentially intermixed data read and data write request signals. As illustrated in FIG. 13 the data read signals on control bus 58 take the form of read signals R1, R2, R3 and R4 and the write signals take the form of W1, W2, W3 and W4. Memory storage 70 of FIG. 10 provides means for holding data while read buffer 72 provides a first means for reading data from memory storage 70 to data bus 54 and write buffer 74 provides a second means for writing data from data bus 54 to memory 70. Memory clash detection logic 66 of FIG. 9 provides a mechanism for utilizing read buffer 72 in response to a read request signal on bus 60 and for utilizing write buffer 74 in response to a wriee request signal on bus 62 to permit contiguous sequential receipt and subsequent execution of the sequentially intermixed data read and write request signals. In other words, the circuit of FIG. 9 operates to permit read requests R1 through R4 and write requests W1 through W4 of FIG. 13 to be received in request cycle phases of consecutive memory cycles without the requirement of any vacant intermediate request cycle phases and thereafter to be executed although, as described above, this execution may not necessarily be in the precise order of receipt of the read and write request signals.

Nevertheless, the receipt of the read and write request signals and subsequent execution thereof occurs in a sequence whereby 100% bandwidth utilization is achieved. This 100% bandwidth utilization is achieved through the operation of the circuit of FIG. 9 resolving potential clashes between required access of data read buffer 72 and data write buffer 74 to memory 70 and/or to data bus 54 as a consequence of the received sequentially intermixed data read and data write request signals of FIG. 13.

Specifically, the circuit of FIG. 9 resolves potential clashes in favor of data write buffer 74 over dtta read buffer 72. Moreover, the circuit of FIG. 11 in response to the data read and data write requests of FIG. 13, controls operation of read buffer 86 and write buffer 84 of FIG. 12 in synchronism with the utilization of read buffer 72 and write buffer 74 of FIG. 10, respectively.

More specifically, the circuit of FIG. 9 prevents simultaneous generation of READ DATA and WRITE DATA signals at terminals 126 and 128 and prevents the simultaneous generation of READ ACCESS and WRITE ACCESS signals at terminals 124 and 130 during any particular memory cycle. Instead, the circuit of FIG. 9 operates to delay any READ DATA signal scheduled to participate in such a clash until no additional WRITE DATA signal is required. The circuit of FIG. 9 further operates to delay any READ ACCESS signal scheduled to participate in a clash until no additional WRITE ACCESS signal is required.

With regard to the read request and write request signals of FIG. 13, no clash is anticipated when the first read request R1 is received. Neither is any clash anticipated when the second read request R2 is received during memory cYcle 2. However, during memory cycle 3 receipt of write request 1 causes the anticipation of a clash with the data transfer cycle phase of read request R2 during memory cycle 4. This anticipated clash is detected by the operation of AND gate 120 in the circuit of FIG. 9 and by AND gate 238 of FIG. 11. The presence of continued consecutively received write request signals during any subsequent memory cycles maintains the output of AND gates 120 and 238 in a low logic level and, therefore, delay the output of the READ DATA signals at terminals 126 and 246 for read request R2.

In the illustrated memory cycle of FIG. 13, this delay continues uniil memory cycle 5 in which a read request R3 is received, thereby releasing AND gates 120 and 238 from a low logic level to a high logic level during the subsequent memory cycle, thereby permitting data associated with read request R2 to be transferred from read buffer 72 to data bus 54 and from data bus 54 and read buffer 86 during the data transfer cycle phase of memory cycle 6.

However, the receipt of read request R3 in memory cycle 5 after the receipt of write request R2 in memory cycle 4 creates an anticipated clash in the access cycle phase of memory cycle 6. This anticipated clash is detected through operation of latch 112 of the circuit of FIG. 9 and latch 212 of the circuit of FIG. 11. Specifically, a once delayed memory request W2 is present as one input to AND gates 110 and 234 whereess read request R3 is present at the other input of AND gates 110 and 234 during memory cycle 5, thereby causing the output of latches 112 and 212 to set selectors 108 and 220 to the "1" input terminal condition during memory cycle 6. This setting of selectors 108 and 220 delays the outputting of a READ ACCESS signal at terminal 124 for read request R3 until no subsequent write request is received over bus 62 as detected by AND gates 110 and 234. In fact, in the example of FIG. 13 no write request is received during memory cycle 4, accordingly, latches 112 and 212 operate to reset selectors 108 and 220 to the "0" input terminal configuration and, therefore, permits a READ ACCESS signal at terminal 124 during memory cycle 7.

During memory cycle 7 a write request W3 was received subsequent to a read request R4, thereby setting the stage for a potential clash during the data transfer cycle phase of memory cycle 8. This clash is, however, averted through the operation of the FIG. 9 circuitry through detection of the potential clash by AND gate 100 and the delay of a READ DATA signal at output terminal 126 for read request R3 during memory cycle 8 and for read request R4 during memory cycle 9. This delay continues until no subsequent write request is received, namely, the delay continues until memory cycle 9. The absence of a write request during memory cycle 9 releases AND gate 120 during memory cycle 9 which, in turn, permits a READ DATA siqnal for read request R3 durinq memory cycle 10. The operation of counter 116 records the fact that two memory requests had been delayed and permits a subsequent READ DATA signal to appear at terminal 126 during memory cycle 11.

Although startup of the memory system of the subject invention requires a one memory cycle delay in the access cycle phases and a one memory cycle delay in the data transfer cycle phases resulting in a single vacant access cycle phase during memory cycle 4 of FIG. 13 and a single vacant data transfer cycle phase in memory cycle 7, thereafter 100% bandwidth capability is achieved in accordance with the teachings of the subject invention. Thus, subsequent request cycle phases after memory cycle 8 may be complete filled with either read or write requests resulting in 100% bandwidth utilization.

It should be understood that address buffer 68 and address generator 80 of FIG. 8 must be structured so as to delay generation and transmission of addresses in accordnnce with the prearranged schedule of memory clash detection logic 66 and port clash detection logic 76. Thus, address buffer 68 may, for example, comprise two first-in, first-out (FIFO) buffers, one for receipt of addresses associated with write requests and one for receipt of addresses associated with read requests. Memory clash detection logic 66 then simply accesses those buffers in turn in accordance with the prearranged schedule employed by logic 66 to avoid clashes. Similarly, address geneaator 80 may comprise read request and write request address FIFOs which are similarly controlled under the operation of port clash detection logic 76.

It will also be appreciated by those skilled in the art that standard fast memory techniques are applicable to the unique architecture of the subject invention. For example, multiple data buses may be employed to utilize the 100% band width capability of the subject invention. In this regard, multiple data read and data write buffers may also be employed with interleaved connection to multiple data buses.

The high speed memory and related method of the subject invention is particularly applicable to CT scanner technology. Specifically, the subject invention is applicable to fourth generation CT systems which require large amounts of processing, high resolution viewing capability and high input/output band widths. Specifically, the architecture of the subject invention is capable of achieving a 400 MB/second transfer rate with 32 MB of storage using current 256K DRAM technology, using the architecture of the subject invention in combination with known techniques such as interleaving and wide word size. Through utilization of the unique architecture of the subject invention, 100% bandwidth capability and multiport capability with any mixture of memory read and memory write functions is obtainable.

Additional advantages and modifications will readily occur to those skilled in the art. Thus, the invention is not limited to the specific detailed representative methods and illustrative examples shown and described. Instead, departures may be made from such details without departing from the spirit or scope of applicant's general inventive concept.

I claim:

1. A high speed memory system for use with a control bus bearing sequentially intermixed data read and data write request signals and a data bus, said system comprising:

(a) storage means for holding data;

(b) first means, coupled to said storage means and said data bus, for reading data from said storage means onto said data bus in three sequential cycles comprising a request cycle during which a data read request signal appears on said control bus, a data read access cycle during which data is transferred by said first means from said storage means to said first means, and a data read transfer cycle during which said first means transfers said data from said first means to said data bus;

(c) second means, coupled to said storage means and said data bus, for writing data from said data bus into said storage means in three sequential cycles comprising a request cycle during which a data write request signal appears on said control bus, a data read access cycle during which data is transferred by said second means from said data bus to said second means, and a data write transfer cycle during which said second means transfers said data from said second means to said storage means;

(d) memory control means, coupled to said control bus and to said first and second means, for controlling operation of said first means in response to a data read request signal on said control bus and for controlling operation of said second means in response to a data write request on said control bus to permit contiguous sequential receipt and subsequent execution of said sequentially intermixed data read and write request signals on said control bus by arbitrating operation of said data read access cycles, data write access cycles, data read transfer cycles and data write transfer cycles to prevent potential clashes, in the form of attempts by said first and second means to simultaneously utilize said data bus or to simultaneously utilize said memory means, by selective delay of said data read access, data write access, data read transfer, or data write transfer cycles.

2. A system of claim 1 wherein said first means comprises a data read buffer and said second means comprises a data write buffer.

3. A system of claim 2 wherein said memory control means includes means for resolving said potential clashes in favor of said data write buffer.

4. A system of claim 1 including a plurality of port means, responsive to said data read and/or data write request signals on said control bus, for reading data from and/or writing data into said data bus in synchronism with said operation of said first and second means.

5. A high speed memory system comprising:
 (a) a data bus;
 (b) a control bus;
 (c) means for placing data read and data write request signals on said control bus;
 (d) storage means for holding data;
 (e) a memory control including:
  (i) a memory data read buffer means, including a memory data read buffer memory coupled between said data bus and said storage means, for transferring data from said storage means to said memory data read buffer memory in response to a MEMORY READ ACCESS signal and for transferring data from said memory data read buffer memory to said data bus in response to a MEMORY READ DATA signal;
  (ii) a memory data write buffer means, including a memory data write buffer memory coupled between said data bus and said storage means, for transferring data from said data bus to said memory write data memory in response to a MEMORY WRITE DATA signal and for transferring data from said memory data write buffer memory to said storage means in response to MEMORY WRITE ACCESS signal;
  (iii) memory logic means, coupled between said control bus and said memory data read and memory data write buffer means, for generating said MEMORY READ ACCESS and MEMORY READ DATA signals in response to data read request signals received from said control bus, and for generating said MEMORY WRITE DATA and MEMORY WRITE ACCESS signals in response to data write request signals received from said control bus; and for preventing simultaneous generation of MEMORY READ DATA and MEMORY WRITE DATA signals and simultaneous generation of MEMORY READ ACCESS and MEMORY WRITE ACCESS signals to thereby permit contiguous sequential receipt and subsequent execution of sequentially intermixed data read and data write request signals on said control bus.

6. A system of claim 5 wherein said memory logic means includes means for delaying any MEMORY READ DATA signal until no additional MEMORY WRITE DATA signal is required and for delaying any MEMORY READ ACCESS signal until no additional MEMORY WRITE ACCESS signal is required.

7. A system of claim 5 further including a plurality of data ports each of which includes a port data read buffer means for transferring data from said data bus in response to a PORT READ SIGNAL and/or a port data write buffer means for transferring data to said data bus in response to a PORT WRITE DATA signal, each of said data ports further including port logic means for generating said PORT READ DATA signal in response to a data read request signal on said control bus for that port, and for generating said PORT WRITE DATA signal in response to a data write signal on said control bus for that port; and, in response to data read and data write request signals on said control bus, for synchronizing generation of said PORT READ DATA and PORT WRITE DATA signals with generation by said memory logic of corresponding MEMORY READ DATA and MEMORY WRITE DATA signals, respectively.

8. A method for high speed operation of a memory system, comprising the steps of:
 (a) generating data read requests on a control bus to transfer data from a storage for holding data over a data bus to a selected port in sequential READ DATA FROM STORAGE and WRITE DATA INTO DATA BUS cycles;
 (b) generating data write requests on said control bus to transfer data from a selected port over sadd data bus to said storage in sequential READ DATA FROM DATA BUS and WRITE DATA INTO STORAGE cycles, said data write requests and data read requests being contiguously and sequentially intermixable on said control bus;
 (c) preventing simultaneous READ DATA FROM STORAGE and WRITE DATA INTO STORAGE and simultaneous WRITE DATA ONTO DATA BUS and READ DATA FROM DATA BUS CYCLES by detecting from said data read requests and data write requests on said control bus when simultaneous READ DATA FROM STORAGE and WRITE DATA INTO STORAGE and simultaneous WRITE DATA ONTO DATA BUS and READ DATA FROM DATA BUS cycles are scheduled to occur by delaying selected ones of the READ DATA FROM STORAGE, WRITE DATA INTO STORAGE, WRITE DATA ONTO DATA BUS, and READ DATA FROM DATA BUS cycles to prevent simultaneous READ DATA FROM STORAGE and WRITE DATA INTO STORAGE cycles and to prevent simultaneous WRITE DATA ONTO DATA BUS and READ DATA FROM DATA BUS cycles.

9. A method of claim 8 including the further step of transferring, at said ports in response to data read requests and data write requests on said control bus, data between those ports and said data bus as a function of said delaying of said selected ones of said cycles.

* * * * *